(12) United States Patent
Kim et al.

(10) Patent No.: US 8,722,442 B2
(45) Date of Patent: May 13, 2014

(54) NITROGEN-DOPED TRANSPARENT GRAPHENE FILM AND MANUFACTURING METHOD THEREOF

(75) Inventors: Sang Ouk Kim, Daejeon (KR); Jin Ok Hwang, Daejeon (KR); Duck Hyun Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 154 days.

(21) Appl. No.: 13/298,166

(22) Filed: Nov. 16, 2011

(65) Prior Publication Data

US 2012/0161192 A1 Jun. 28, 2012

(30) Foreign Application Priority Data

Dec. 22, 2010 (KR) ........................ 10-2010-0132532

(51) Int. Cl.
 *H01L 21/00* (2006.01)
 *H01L 33/42* (2010.01)
 *H01L 31/18* (2006.01)
 *H01L 31/0288* (2006.01)

(52) U.S. Cl.
 USPC ................ 438/45; 438/57; 257/102; 257/439

(58) Field of Classification Search
 USPC ................................ 257/102, 439; 438/45, 57
 See application file for complete search history.

(56) References Cited

U.S. PATENT DOCUMENTS

| | | | |
|---|---|---|---|
| 8,182,917 B2 * | 5/2012 | Robinson et al. ............. | 428/408 |
| 8,227,685 B2 * | 7/2012 | Choi ............................. | 136/252 |
| 8,293,607 B2 * | 10/2012 | Afzali-Ardakani et al. .. | 438/283 |
| 8,513,653 B2 * | 8/2013 | Woo et al. ..................... | 257/40 |
| 2009/0071533 A1 * | 3/2009 | Choi et al. .................... | 136/252 |
| 2009/0146111 A1 * | 6/2009 | Shin et al. ..................... | 252/510 |
| 2011/0030772 A1 * | 2/2011 | Veerasamy ................... | 136/256 |
| 2011/0127471 A1 * | 6/2011 | Shin et al. ..................... | 252/506 |
| 2011/0227000 A1 * | 9/2011 | Ruoff et al. ................... | 252/502 |
| 2012/0012796 A1 * | 1/2012 | Chen et al. .................... | 252/502 |
| 2012/0049239 A1 * | 3/2012 | Sung ............................. | 257/103 |
| 2012/0068161 A1 * | 3/2012 | Lee et al. ...................... | 257/29 |
| 2012/0097238 A1 * | 4/2012 | Isaacs-Sodeye .............. | 136/256 |
| 2012/0098028 A1 * | 4/2012 | Naito ............................ | 257/103 |
| 2012/0247545 A1 * | 10/2012 | Aria et al. ..................... | 136/255 |
| 2012/0328906 A1 * | 12/2012 | Kwon et al. .................. | 428/688 |

OTHER PUBLICATIONS

Ying Wang et al.; Nitrogen-Doped Graphene and Its Application in Electrochemical Biosensing; ASC NANO; vol. 4, No. 4; Apr. 7, 2010; American Chemical Society; pp. 1790-1798.

(Continued)

*Primary Examiner* — Evan Pert
(74) *Attorney, Agent, or Firm* — Stevens & Showalter LLP

(57) ABSTRACT

Provided is a transparent graphene film which is prepared by maintaining the primary reduced state of a graphene oxide thin film via chemical reduction, reducing the graphene oxide thin film with chemical vapor deposition, and doping nitrogen, thereby enhancing the conductivity and enabling the control of work function and a manufacturing method thereof. According to the present disclosure, a flexible, transparent, electrical conductivity-enhanced, and work function controllable graphene film can be large area processed and produced in large quantities so that can be applied in real industrial processes by forming a graphene oxide thin film on a substrate, performing the primary chemical reduction using a reducing agent, and performing further the secondary thermal reduction and nitrogen doping by injecting hydrogen and ammonia gas through chemical vapor deposition equipment.

18 Claims, 5 Drawing Sheets

(56) References Cited

OTHER PUBLICATIONS

Yanwu Zhu et al.; Exfoliation of Graphite Oxide in Propylene Carbonate and Thermal Reduction of the Resulting Graphene Oxide Platelets; ASC NANO; vol. 4, No. 2; Jan. 29, 2010; American Chemical Society; pp. 1227-1233.

Jin Ok Hwang et al.; Workfunction-Tunable, N-Doped Reduced Graphene Transparent Electrodes for High-Performance Polymer Light-Emitting Diodes; ACS NANO; vol. 6, No. 1, Dec. 13, 2011; American Chemical Society; pp. 159-167.

* cited by examiner

NITROGEN-DOPED TRANSPARENT GRAPHENE FILM AND MANUFACTURING METHOD THEREOF

CROSS REFERENCE TO RELATED APPLICATION

This application claims the benefit of Korean Patent Application No. 10-2010-0132532 filed on Dec. 22, 2010, which is hereby incorporated by reference in its entirety into this application.

BACKGROUND

1. Technical Field

The present disclosure disclosed herein relates to a nitrogen-doped transparent graphene film and a manufacturing method thereof, and more particularly, to a transparent graphene film which is prepared by maintaining the primary reduced state of a graphene oxide thin film via chemical reduction, reducing the graphene oxide thin film with chemical vapor deposition, and doping nitrogen, thereby enhancing the conductivity and enabling the control of work function and a manufacturing method thereof.

2. Description of the Related Art

Graphene refers to a two-dimensional monolayer structure wherein six-carbon hexagons are connected to each other, and is different from zero-dimensional fullerene, carbon nanotube having a tube-shaped one-dimensional structure, and graphite having a three-dimensional structure. Graphene shows the same behavior as massless Dirac fermions and exhibits the electron mobility of 15,000 cm2V-1s-1 or more at room temperature. It was reported that the tensile strength of graphene is twice or more than that of diamond and 200 to 300 times greater than that of steel. In addition, since graphene is a single carbon layer, it has excellent transparency. Various application possibilities of graphene are being forecasted, owing to its excellent electrical, mechanical, and optical properties.

In order to manufacture graphene, various methods have been suggested and a mechanical method, chemical vapor deposition (CVD), and a chemical method have been reported as representative manufacturing methods.

A mechanical method is to exfoliate graphene from graphite using a sticky tape and has advantages that the size of the manufactured graphene is large about from tens to hundreds of micrometers and intact graphene of which natural properties are not damaged can be obtained. However, it has a limitation in mass-production and has a disadvantage that only graphite can be a source.

Chemical vapor deposition is a method by the chemical reaction of vapor phase components to form a graphene thin film on the substrate surface deposited with certain metals and it has been recently reported in academics. Using this method, graphene with relatively small defects can be obtained. However, the production cost is high and graphene can be grown only on a specimen deposited with certain metals, and a process to transfer grown graphene to desired substrate is required.

A chemical method is a method to obtain graphene by treating graphite with a strong oxidizing agent to form graphene oxide, followed by chemical or thermal reduction of graphene oxide. For chemical reduction, the reduction reaction is induced by the addition of a reducing agent such as hydrazine ($N_2H_4$) or potassium hydroxide. For thermal reduction, the reduction reaction is induced by high heat treatment in vacuum or hydrogen atmosphere. Using this method, graphene can be produced inexpensively in large quantities. Using functional groups of graphene oxide which is produced during the making process of graphene, other functional groups or metal particles can be added so that the application is more extensive. However, a chemical method has disadvantages that graphene produced by this method has many defects and its electrical property is poor than that of natural graphene.

As stated before, graphene can be applied for various fields because it has excellent optical, mechanical, and electrical properties. Particularly, attempts to use graphene for transparent electrodes are being made. Methods of using graphene for transparent electrodes start from manufacturing methods for graphene stated before. Therefore, manufacturing methods for transparent electrodes can also be classified in the same way as manufacturing methods for graphene, and advantages and disadvantages of manufactured electrodes also should follow those advantages and disadvantages as enumerated in manufacturing methods for graphene. First, a method to obtain graphene by the mechanical exfoliation of graphite may be quite a useful way to do basic physical research; however, it is excluded from manufacturing methods for electrodes because mass-production and application to large area substrate are impossible.

Second, chemical vapor deposition has an advantage that it can produce graphene with relatively small defects; however, it has limitations that the process can be made only on certain metal substrate and the cost is highly expensive and the secondary defects may be induced during the process of transferring synthesized graphene to desired substrate. Finally, there is a way to produce graphene films in large quantities via a chemical method of making graphene oxide substance from graphite, followed by effective reduction methods. However, while this method has an advantage that mass-production can be accomplished, it has limitations that during the production of graphene oxide from graphite, many defects are produced by strong acid treatment and the graphene film cannot exhibit excellent electrical property which is the characteristic of natural graphene.

BRIEF SUMMARY

In the present disclosure, in order to address these problems, the inventors exerted all possible efforts and consequently found that a transparent graphene film which is not only excellent in flexibility and electrical property but also transparent so that can be applied in real industrial processes can be manufactured by forming a graphene oxide thin film on a substrate, followed by performing the primary chemical reduction with a reducing agent and further the secondary thermal reduction and nitrogen doping by injecting hydrogen and ammonia gas using chemical vapor deposition equipment.

The present disclosure provides a method for manufacturing a transparent graphene film which has excellent flexibility and excellent electrical property so that can be applied in real industrial processes by using a graphene oxide thin film and a transparent graphene film of which work function is controllable manufactured by the same method.

The present disclosure also provides a display device including the transparent graphene film, an organic electroluminescent device, and a solar cell.

Embodiments of the present disclosure provide methods for manufacturing a transparent graphene film doped with nitrogen by chemical and thermal reduction of a graphene oxide thin film so that conductivity is enhanced and work function is controllable, the method including the following steps of: (a) forming a graphene oxide thin film on a substrate; (b) performing primary chemical reduction on the graphene oxide thin film formed on the substrate using a reducing agent; and (c) manufacturing a transparent graphene film by performing secondary thermal reduction and nitrogen doping on the primarily chemically reduced graphene oxide thin film.

In other embodiments of the present disclosure, there are provided transparent graphene films manufactured by the method and doped with nitrogen, wherein the transparent graphene film has conductivity in a range from about 4,900 S/cm to about 5,100 S/cm when the thickness of the transparent graphene film is about 10 nm.

In still other embodiments of the present disclosure, there are provided display devices including the transparent graphene film.

In yet other embodiments of the present disclosure, there are provided organic electroluminescent devices including: an anode; a hole transport layer; a light-emitting layer; an electron transport layer; and a cathode, wherein the anode is the transparent graphene film.

In further embodiments of the present disclosure, there are provided solar cells including the transparent graphene film.

According to the present disclosure, a flexible, transparent, conductivity-enhanced, and work function-controllable film (electrode) can be large area processed and produced in large quantities by forming a graphene oxide thin film on a substrate, performing the primary chemical reduction using a reducing agent, and performing further the secondary thermal reduction and nitrogen doping by injecting hydrogen and ammonia gas through chemical vapor deposition equipment.

DETAILED DESCRIPTION

The present disclosure was intended to make sure that a transparent graphene film which enables the control of work function and has enhanced electrical conductivity can be manufactured by forming a graphene oxide thin film on a substrate, followed by performing the primary chemical reduction and performing the secondary thermal reduction and nitrogen doping.

In one embodiment of the present disclosure, it was found that a transparent graphene film was manufactured by forming a graphene oxide thin film on a substrate, inducing the primary reduction and nitrogen doping by hydrazine vapor, injecting hydrogen and ammonia gas through chemical vapor deposition equipment to perform further the secondary thermal reduction and nitrogen doping. After measuring the result of sheet resistance of the manufactured transparent graphene film, it was found that the electrical conductivity was excellent. In addition, transparent graphene films which were reduced under various conditions had different work function values. From this, it was found that an electrode of which work function is controllable could be manufactured.

Therefore, from one point of view, the present disclosure relates to a method for manufacturing a transparent graphene film in which nitrogen is doped by chemical and thermal reduction of a graphene oxide thin film so that the conductivity is enhanced and the work function is controllable, including the steps of (a) forming a graphene oxide thin film on a substrate; (b) performing the primary chemical reduction of the graphene oxide thin film formed on the substrate using a reducing agent; and (c) manufacturing a transparent graphene film by performing the secondary thermal reduction and nitrogen doping of the primarily chemically reduced graphene oxide thin film.

Figure 1:
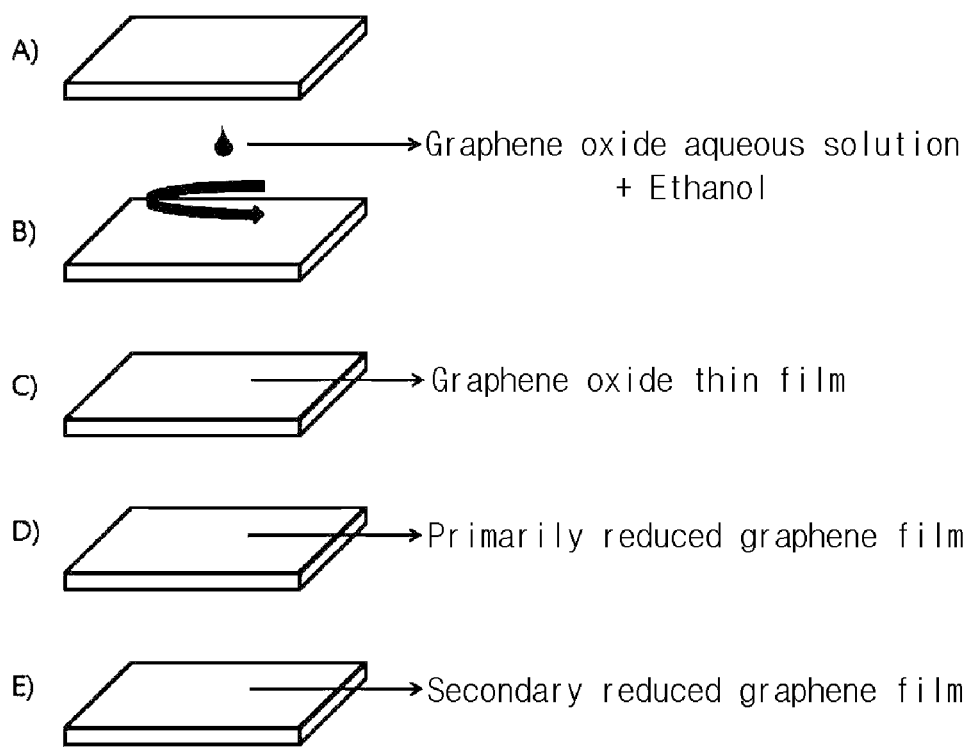
FIG. 1 is an explanatory drawing showing a method for manufacturing a transparent graphene film of which conductivity is enhanced through chemical and thermal reduction of a graphene oxide thin film according to one embodiment of the present disclosure.

FIG. 1 is an explanatory drawing showing a method for manufacturing a transparent graphene film of which conductivity is enhanced through chemical and thermal reduction of a graphene oxide thin film according to one embodiment of the present disclosure.

In the present disclosure, any substrate may be used for the substrate without limitation, so long as it belongs to substrates which are conventionally used in the pertinent art in accordance with the pertinent application purpose and examples of substrates include glass, quartz, $Si/SiO_2$, polyethylene terephthalate (PET), polycarbonate (PC), polyimide (PI), polyethylene naphthalate (PEN), polystyrene (PS), and the like, and transparent glass or quartz substrates are preferred.

For the substrate, it is preferred to use a washed substrate in order to remove impurities. The substrate may be washed by either dry washing or wet washing, and UV/Ozone treatment or ultrasonic cleaning in organic solvent such as acetone, ethanol, and the like may be used, and preferably, the substrate may be washed by wet washing with Piranha solution. The washing method includes the process of treating a substrate with Piranha solution which is a mixture of about 95-97% sulfuric acid and about 25-31% hydrogen peroxide at a ratio of about 7:3 while maintaining temperature at about 105-115° C. for about 50-70 minutes to remove impurities on the substrate surface.

In the present disclosure, graphene oxide manufactured by a conventionally used method in the pertinent art may be used for the graphene oxide. For example, oxidation of graphite by addition of a strong acidic agent into the starting material graphite generates oxygen functional groups in each layer (graphene layer) and each layer is separated from one another due to repulsive power of those functional groups and is generally called as graphene oxide. Graphene oxide disperses readily in water and can easily work on the formation of thin films because mixing graphene oxide with appropriate organic solvent increases volatility of solvent in the coating process.

In the present disclosure, a graphene oxide thin film may be formed on the substrate by spin coating or spray coating method. The spin coating method which is a technique used in various semiconductor process area during the last few decades is generally a method of forming a thin film by applying a solution to the center of sample and high-speed spin-drying and thickness of the thin film may be controlled by means of the concentration of the solution and the number of rotation per minute of a spin coater:

The spray coating method is a technique in which a coating solution is sprayed by pressure or ultrasonic waves from a nozzle and then the gaseous coating solution is attached directly to a substrate and thickness of the thin film may be controlled by means of the concentration of a coating solution and the speed of spraying while spraying.

In the present disclosure, for the coating solution which is used for the spin coating or spray coating, a mixture of ethanol and graphene oxide aqueous solution at a ratio of 1:1 by volume is preferred. In this case, it is preferred to use the graphene oxide aqueous solution of which the concentration is from about 0.2 to about 0.4 wt %. In case that the concentration of the graphene oxide aqueous solution is less than about 0.2 wt %, there is a problem that coating should be repeated in order to obtain desired transparency and conductivity. In case that the concentration of the graphene oxide aqueous solution is more than about 0.4 wt %, there is a problem that the thickness of coating is too thick whereby the transmittance is lowered. Generally, a film of which transmittance is about 80% or more at a wavelength of about 550 nm may be used for a transparent electrode.

It is preferred that the thickness of the graphene oxide thin film formed on the substrate is adjusted appropriately in a range of from about 5 nm to about 10 nm. In case that the thickness of the oxide thin film is more than about 10 nm, there is a problem that the transmittance is lowered. In case that the thickness of the oxide thin film is less than about 5 nm, there is a problem that increase in conductivity is insubstantial.

In the present disclosure, chemical reduction of a graphene oxide thin film formed on the substrate is characterized by exposing a graphene oxide thin film to vapor of a reducing agent formed by heating the reducing agent solution.

Any reducing agent may be used for the reducing agent without limitation, so long as it belongs to something which functions as a reducing agent, that is, something which offers electrons for graphene oxide whereby removes some oxygen functional groups from graphene oxide, and examples of the reducing agents include hydrazine ($N_2H_4$), potassium hydroxide (KOH), sodium hydroxide (NaOH), sodium bisulfate ($NaHSO_4$), sodium sulfite ($Na_2SO_3$), thionyl chloride ($SOCl_2$), sulfur dioxide ($SO_2$), and the like.

In case that the reducing agent is a reducing agent including nitrogen (N), chemical reduction and nitrogen doping can be achieved at the same time.

Since this process may lead to chemical reaction on the graphene oxide thin film of reducing agent molecules prior to the secondary thermal reduction and cause the effect of removal and substitution of some oxygen functional groups which are generated from graphite oxidation process and lower the electrical conductivity, it may lead to reduction and nitrogen doping of the graphene thin film. Herein, the substitution means to replace an oxygen functional group to a substance including N.

Nitrogen has five peripheral electrons and among them, three participate in bond formation and two exist as lone pair electron which does not participate in bond formation. Graphene oxide obtained by oxidation and exfoliation of graphite has a great many defects on basal plane. When nitrogen is doped and incorporated into where defects exist, lone pair electrons make electrons flow well so that electrical conductivity is improved; compared to when carbon which does not have lone pair electrons exists.

In the present disclosure, manufacturing a transparent graphene film by performing the secondary thermal reduction and nitrogen doping of the primarily chemically reduced graphene oxide thin film may be characterized by being performed in chemical vapor deposition equipment. In other words, when the primarily chemically reduced graphene oxide thin film is placed in chemical vapor deposition equipment and then hydrogen and ammonia gas are injected at the same time while heating at 500 to 1,200° C., oxygen functional groups on the graphene oxide thin film are removed as $H_2O$ by hydrogen and substituted or nitrogen-doped by ammonia gas and thus the transparent graphene film represented by chemical formula 1 shown below can be manufactured.

Chemical formula 1

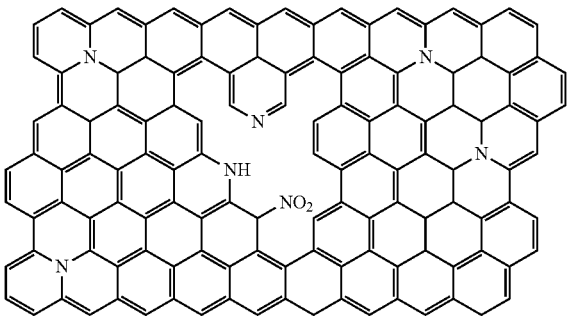

The mixing ratio of hydrogen and ammonia gas may be characterized by being about 55 to 65%:45 to 35%. In case that the mixing ratio of hydrogen and ammonia gas is beyond the range, it is possible that the removal of oxygen functional groups or nitrogen doping of graphene oxide thin film may not be achieved smoothly.

From other point of view, the present disclosure relates to a transparent graphene film wherein the transparent graphene film is manufactured by a method for manufacturing a conductivity-enhanced transparent graphene film through chemical and thermal reduction of the graphene oxide thin film, and nitrogen is doped, and electrical conductivity is from about 4,900 to about 5,100 S/cm when the thickness is about 10 nm. In the pertinent art, graphene films are often used for graphene electrodes.

Therefore, from still other point of view, the present disclosure relates to a display device including the transparent graphene film.

Examples of the display device include liquid crystal display devices, electronic paper display devices, organic electroluminescent devices, and the like. When a transparent graphene film according to the present disclosure is used in the display device for electrodes, it is possible to bend the display device freely and thus increase convenience.

Among these display devices, the organic luminescent display device is an active luminescent display device using a phenomenon in which when electric current is allowed to flow through a fluorescent or phosphorescent organic compound thin film, an electron and a hole combine in the organic film whereby light is generated. A general organic electroluminescent device has the structure in which an anode is formed on a substrate, and a hole transport layer, a light-emitting layer, an electron transport layer, and a cathode are sequentially formed on the anode. In order to make the injection of electron and hole easier, an electron injection layer and a hole injection layer may be formed further. A hole blocking layer, a buffer layer, and the like may be formed further whenever necessary. For the anode, by its nature, a material which is transparent and has excellent conductivity is preferred, and therefore the transparent graphene film according to the present disclosure may be useful.

Therefore, from even other point of view, the present disclosure relates to an organic electroluminescent device wherein the organic electroluminescent device includes an anode; a hole transport layer; a light-emitting layer; an electron transport layer; and a cathode, and the anode is the transparent graphene film. The organic electroluminescent device may further include an electron injection layer and a hole injection layer.

From yet other point of view, the present disclosure relates to a solar cell including the transparent graphene film.

In also case of a solar cell, since the use of a transparent graphene film according to the present disclosure allows various curve structures and effective utilization of light, light efficiency can be improved.

The present disclosure will be described in more detail through the following examples. Those examples are to explain the present disclosure more specifically and it would be obvious to those skilled in the art that the scope of the present disclosure shall not be limited to those examples.

EXAMPLES

Example 1

Manufacture of Conductivity-Enhanced Transparent Graphene Film

A glass substrate (1 cm×1 cm, Corning 1737) was immersed in Piranha solution in which sulfuric acid (95-97%, MERCK) and hydrogen peroxide (30%, JUNSEI) were mixed at a ratio of about 7:3 at 110° C. for 1 hour to be washed.

Graphene oxide aqueous solution of 0.3 wt % concentration was mixed with ethanol (A.C.S. Reagent, J. T. Baker) at a ratio of 1:1 and was spin coated on the washed glass substrate and then uniform graphene oxide thin film of about 5 to 10 nm was formed on the glass substrate.

A manufacturing method for the graphene oxide aqueous solution is as follows. 1 g of graphite was added to a round bottom flask, and while adding 45 ml of sulfuric acid (97%, MERCK) drop wise, 3.5 g of potassium permanganate ($KMnO_4$, Sigma-Aldrich, ACS reagent≥99%) was then added thereto slowly. Since this is an exothermic reaction, the temperature was lowered with ice. After reaction for 6 hours in a bath at 35° C., the temperature was lowered with ice again and 200 ml of deionized water was added thereto drop wise slowly. 20 ml of hydrogen peroxide (30%, JUNSEI) was then added thereto drop wise slowly under the condition of ice bath and stirred for 30 to 60 minutes. Then, graphite oxide was separated with a vacuum pump and a Buchner funnel (M size) and washed five times with 10% dilute hydrochloric acid (HCl, JUNSEI) and three times with acetone (Sigma-Aldrich, ACS reagent≥99.5%). After drying in a vacuum oven for 12 or more hours, graphite oxide was scraped off and weighed and then dispersed in deionized water to be 0.3 wt % and sonicated for 3 hours. Graphene oxide exfoliated from graphite oxide by sonication was dialyzed using a molecular porous membrane for 10 days and the aqueous solution in which graphene oxide was dispersed was collected.

In order to induce the primary chemical reduction and nitrogen doping of the graphene oxide thin film formed on the glass substrate, the glass substrate on which graphene oxide thin film was formed was placed into a laboratory dish (a glass plate) with a cover and 2 to 3 ml of hydrazine solution (hydrazine monohydrate, 98%, Sigma-Aldrich) was dropped thereto and after covering, the laboratory dish was sealed. In order to produce hydrazine vapor, the sealed laboratory dish was maintained on a hot plate at 110° C. for 30 minutes and chemical reduction and nitrogen doping of graphene oxide thin film was induced.

Figure 2:
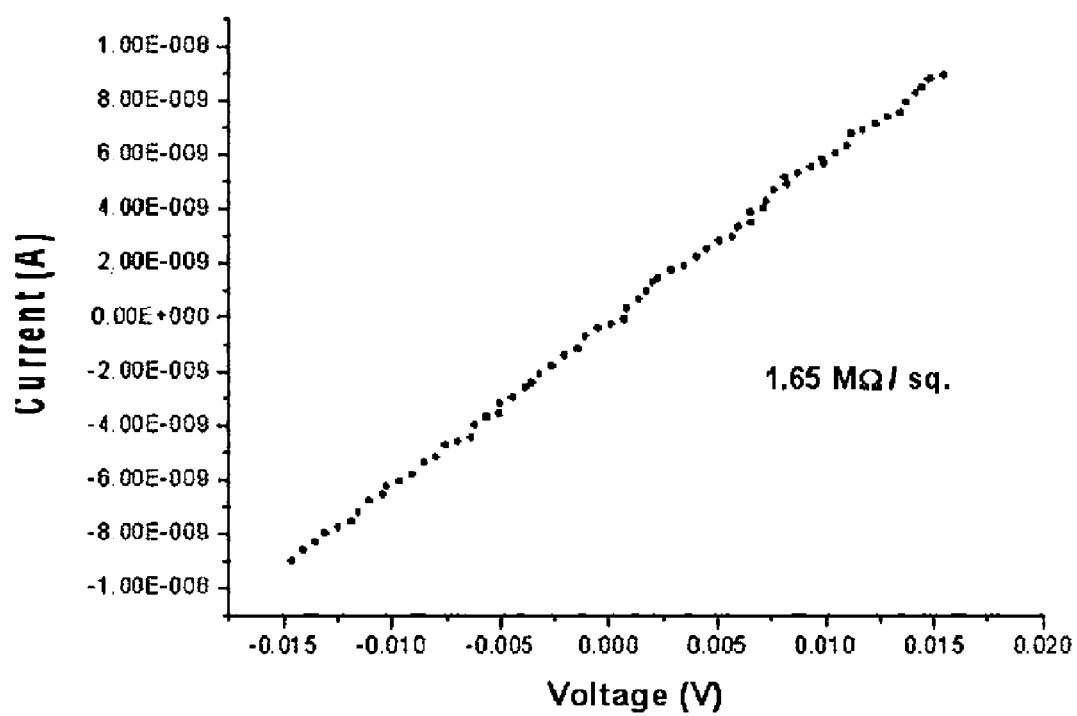
FIG. 2 is a graph showing the result of measurement on electrical conductivity of the primarily chemically reduced and nitrogen-doped graphene thin film manufactured according to one embodiment of the present disclosure.

Electrical conductivity of the primarily chemically reduced and nitrogen doped graphene thin film was measured by 4-point probe and the result was shown in FIG. 2.

As shown in FIG. 2, the primarily chemically reduced and nitrogen doped graphene thin film exhibited considerably enhanced electrical conductivity compared to graphene oxide thin film which is an electrical insulator.

Next, the primarily chemically reduced graphene thin film was exposed to heat, hydrogen, and ammonia gas and the secondary enhancement of electrical conductivity was induced. First, the graphene thin film which was formed through the primary chemical reduction was placed into chemical vapor deposition equipment and a vacuum state was maintained sufficiently using a pump and then while injecting hydrogen and ammonia gas at the same time at 750° C., the additional reduction process was completed and thus a transparent graphene film was manufactured. Herein, 3 minutes were spent in elevating the temperature to 750° C. and the temperature was maintained for 5 minutes. In addition, the ratio of hydrogen and ammonia gas to be injected was maintained at $H_2$ (60 sccm) and $NH_3$ (40 sccm) and hydrogen and ammonia gas were flowed until the temperature was cooled to room temperature.

Figure 3:
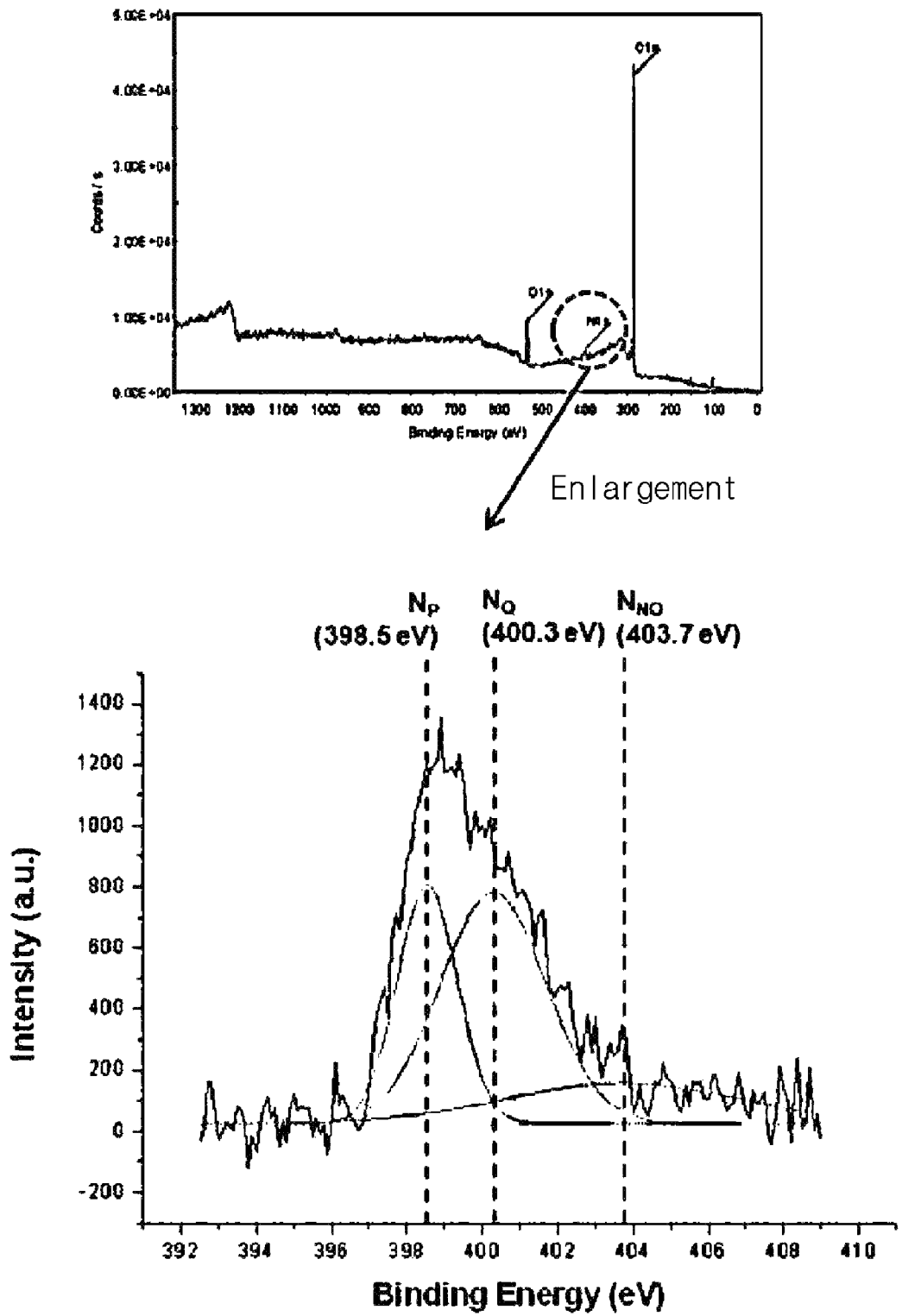
FIG. 3 is a graph showing the measurement result of XPS (X-ray photoelectron spectroscopy) which confirms nitrogen doping of a transparent graphene film according to one embodiment of the present disclosure.

Nitrogen doping of manufactured transparent graphene film was confirmed by XPS (X-ray photoelectron spectroscopy) measurement and the result was shown in FIG. 3.

From FIG. 3, it was found that the manufactured transparent graphene film has 2.8% of nitrogen doping rate and nitrogen was doped on the graphene in three forms of quaternary nitrogen, pyridinic nitrogen, and nitrogen oxide.

Experimental Example 1

Measurement of Sheet Resistance of Transparent Graphene Film

Figure 4:
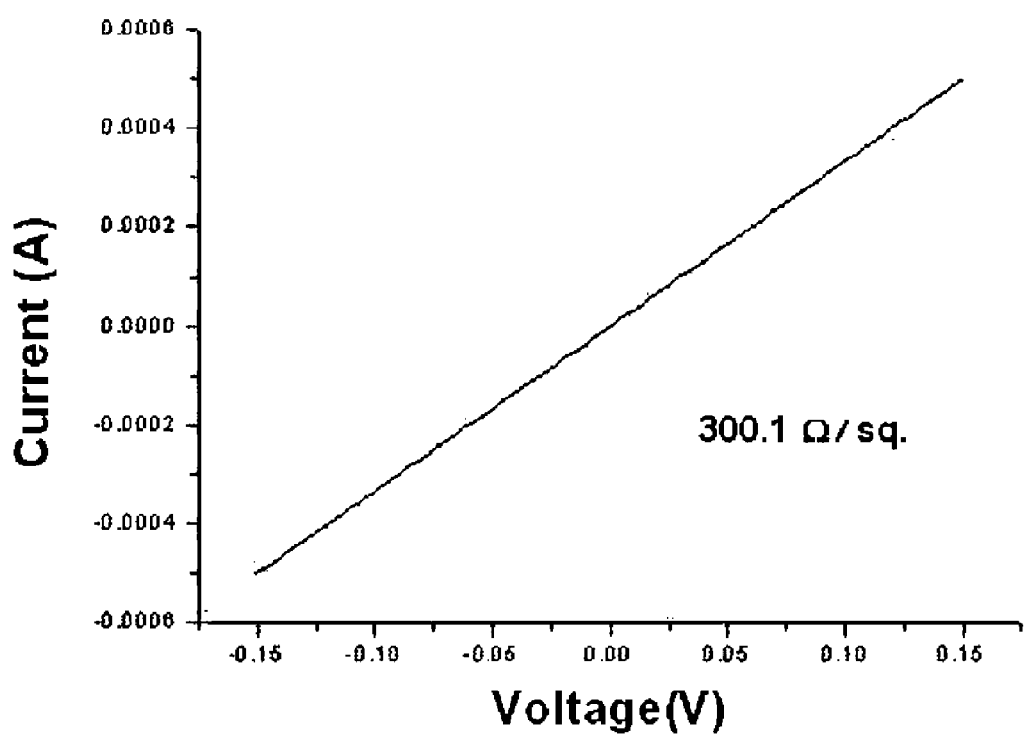
FIG. 4 is a graph showing the measurement of sheet resistance of a transparent graphene film according to one embodiment of the present disclosure.
Figure 5:
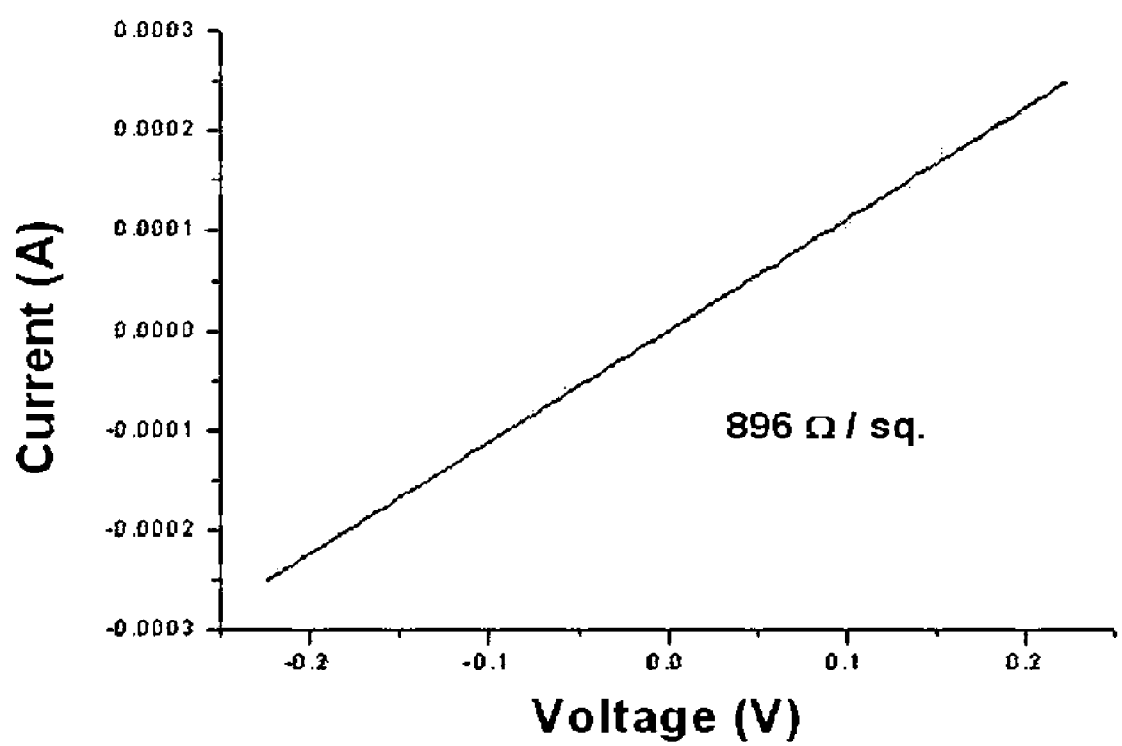
FIG. 5 is a graph showing the measurement of sheet resistance of a transparent graphene film wherein chemical reduction was not performed.

In order to determine electrical conductivities of the transparent graphene film manufactured in Example 1 and a transparent graphene film manufactured by the same method as described in Example 1 wherein the transparent graphene film was not allowed to pass through the primary chemical reduction and nitrogen doping, but was allowed to pass through only thermal reduction, sheet resistance was measured using a surface resistance measurement system and the results were shown in FIG. 4 and FIG. 5. For measurement of sheet resistance, 4-point probe was used. Sheet resistance was measured using Keithley 2635 SourceMeter in an air atmosphere. The smaller sheet resistance value is, the better electrical conductivity is.

As shown in FIG. 4. and FIG. 5, while sheet resistance of the transparent graphene film manufactured in Example 1 wherein the transparent graphene film was allowed to pass through chemical and thermal reduction in sequential order and nitrogen doping was 300.1 Ω/sq., that of the transparent graphene film which was not allowed to chemical reduction but was allowed to thermal reduction only was 896 Ω/sq. Therefore, it was found that electrical conductivity of the transparent graphene film in Example 1 was significantly increased.

Experimental Example 2

Determination of Work Function Controllability of Transparent Graphene Films

Transparent graphene films in Example 1 were manufactured under the conditions described in the following Table 1 and work functions of manufactured transparent graphene films were measured by UPS (Ultraviolet Photoelectron Spectrometer).

TABLE 1

| Condition | Hydrazine/ work-function | No Hydrazine/ Work-function |
|---|---|---|
| 750° C., $H_2$ (100, $NH_3$ (0) | $\phi_{GR}$ = 4.22 eV | $\phi_{GR}$ = 4.41 eV |
| 750° C., $H_2$ (90, $NH_3$ (10) | $\phi_{GR}$ = 4.34 eV | $\phi_{GR}$ = 4.36 eV |
| 750° C., $H_2$ (80, $NH_3$ (20) | $\phi_{GR}$ = 4.27 eV | $\phi_{GR}$ = 4.34 eV |
| 750° C., $H_2$ (70, $NH_3$ (30) | $\phi_{GR}$ = 4.24 eV | $\phi_{GR}$ = 4.20 eV |
| 750° C., $H_2$ (60, $NH_3$ (40) | $\phi_{GR}$ = 4.25 eV | $\phi_{GR}$ = 4.23 eV |
| 750° C., $H_2$ (50, $NH_3$ (50) | $\phi_{GR}$ = 4.21 eV | $\phi_{GR}$ = 4.31 eV |
| Only Hydrazine treatment | $\phi_{GR}$ = 4.16 eV | |

The work function is the minimum work or energy needed to pull one electron which exists in a substance out of the substance and it is known that when the degree of doping is uniform, the work function is constant. However, from Table 1, it was found that transparent graphene films manufactured under various conditions have respective characteristic work functions for each conditions and from this, manufacturing a transparent film of which work function is controllable can be achieved.

The subject matter of the present disclosure is described above in detail. To those skilled in the art, the foregoing detailed description is only the preferred embodiments and it would be obvious that this detailed description shall not limit the scope of the present disclosure. Thus, the actual scope of the present disclosure is to be determined by the accompanying claims and their equivalents.

What is claimed is:

1. A method for manufacturing a transparent graphene film doped with nitrogen by chemical and thermal reduction of a graphene oxide thin film so that conductivity is enhanced and work function is controllable, the method comprising the following steps of: (a) forming a graphene oxide thin film on a substrate; (b) performing primary chemical reduction on the graphene oxide thin film formed on the substrate using a reducing agent; and (c) manufacturing a transparent graphene film by performing secondary thermal reduction and nitrogen doping on the primarily chemically reduced graphene oxide thin film.

2. The method of claim 1, wherein the substrate is selected from the group consisting of glass, quartz, Si/$SiO_2$, polyethylene terephthalate (PET), polycarbonate (PC), polyimide (PI), polyethylene naphthalate (PEN), and polystyrene (PS).

3. The method of claim 1, wherein the step of (a) forming a graphene oxide thin film is being performed by spin coating or spray coating.

4. The method of claim 3, wherein the spin coating and spray coating use ethanol and a graphene oxide aqueous solution at a mixing ratio of 1:1 by volume.

5. The method of claim 4, wherein the concentration of the graphene oxide aqueous solution is from 0.2 wt % to 0.4 wt %.

6. The method of claim 1, wherein the reducing agent is selected from the group consisting of hydrazine ($N_2H_4$), potassium hydroxide (KOH), sodium hydroxide (NaOH), sodium bisulfate ($NaHSO_4$), sodium sulfite ($Na_2SO_3$), thionyl chloride ($SOCl_2$), and sulfur dioxide ($SO_2$).

7. The method of claim 1, wherein when the reducing agent is a reducing agent including nitrogen (N), chemical reduction and nitrogen doping is achieved at the same time.

8. The method of claim 1, wherein the step (b) is performed by exposing the graphene oxide thin film to vapor of the reducing agent formed by heating a reducing agent solution.

9. The method of claim 1, wherein the thermal reduction and nitrogen doping of the step (c) are performed in chemical vapor deposition equipment.

10. The method of claim 9, wherein the thermal reduction and nitrogen doping are performed by injecting hydrogen and ammonia gas at the same time while heating at from 500° C. to 1,200° C.

11. The method of claim 10, wherein the mixing ratio of hydrogen and ammonia gas is 55% to 65%:45% to 35%.

12. A transparent graphene film manufactured by a method, the method comprising: (a) forming a graphene oxide thin film on a substrate; (b) performing primary chemical reduction on the graphene oxide thin film formed on the substrate using a reducing agent; and (c) manufacturing a transparent graphene film by performing secondary thermal reduction and nitrogen doping on the primarily chemically reduced graphene oxide thin film, wherein the transparent graphene film has a controllable work function.

13. A device comprising a transparent graphene film manufactured by a method, the method comprising: (a) forming a graphene oxide thin film on a substrate; (b) performing primary chemical reduction on the graphene oxide thin film formed on the substrate using a reducing agent; and (c) manufacturing a transparent graphene film by performing secondary thermal reduction and nitrogen doping on the primarily chemically reduced graphene oxide thin film; wherein the transparent graphene film has a controllable work function.

14. The device of claim 13, wherein the device is selected from the group consisting of liquid crystal display devices, electronic paper display devices, and organic electroluminescent devices.

15. An organic electroluminescent device comprising: an anode; a hole transport layer; a light-emitting layer; an electron transport layer; and a cathode, wherein the anode comprises a transparent graphene film having a controllable work function.

16. The organic electroluminescent device of claim 15, further comprising: an electron injection layer and a hole injection layer.

17. The device of claim 13 wherein the device is a solar cell.

18. The device of claim 13 wherein the device is a display.

* * * * *